United States Patent [19]

De Lamare et al.

[11] 4,119,933

[45] Oct. 10, 1978

[54] MECHANICAL ARTIFICIAL REVERBERATION APPARATUS

[75] Inventors: Eric P. De Lamare, Clamart; Pierre D. Dudon, Cachan, both of France

[73] Assignee: Telediffusion de France, Montrange, France

[21] Appl. No.: 777,278

[22] Filed: Mar. 14, 1977

[30] Foreign Application Priority Data

Mar. 26, 1976 [FR] France ............................... 76 08795

[51] Int. Cl.[2] ......................... H03H 9/30; G10H 1/02

[52] U.S. Cl. .................................. 333/30 R; 84/1.24; 179/1 J

[58] Field of Search .................... 333/30 R, 30 M, 71; 179/1 J, 109; 84/1.24, 1.25, 1.26, DIG. 21, DIG. 26

[56] References Cited

U.S. PATENT DOCUMENTS 3,761,629 9/1973 Suzuki .................................. 179/1 J

*Primary Examiner*—Alfred E. Smith

*Assistant Examiner*—Marvin Nussbaum

[57] ABSTRACT

A reverberation apparatus is adapted for mechanical matching characteristics and comprises at least one reverberation unit comprising a plurality of lattice construction systems of coil springs for transmitting sound-frequency mechanical vibrations, each spring system of which is connected to an electro-mechanical driver transducer and to a mechanical electrical pick-up transducer. Each system of coil springs forms parts of a lattice in at least two dimensions and in the system, the coil springs are mechanically interconnected at a number of coupling points. In each system of coil springs at least some of the coil springs are connected to a rigid frame.

11 Claims, 4 Drawing Figures

MECHANICAL ARTIFICIAL REVERBERATION APPARATUS

CROSS REFERENCES TO RELATED APPLICATIONS

Applicants hereby make cross references to their French Patent Application PV 76 08795, filed Mar. 26, 1976 and claims priority thereunder following the provisions of 35 U.S.C. 119.

BACKGROUND OF THE INVENTION

1. Field of the Invention

The present invention relates to mechanical reverberation apparatus artificially constructed and adapted to produce acoustic effects similar to those occuring spontaneously when sounds are transmitted in a partly or completely enclosed room or in a space bounded by walls reflecting the acoustic waves.

More specifically, the invention relates to reverberation units adapted to be inserted between a) an electromechanical driver transducer receiving sound-frequency electric input signals produced by a microphone connected to an amplifier and converting them into mechanical vibrations and b) a mechanical to electrical pick-up transducer receiving the aforesaid mechanical vibrations and producing an output of new sound-frequency electric signals having a different wave shape from the input signals, solely as a result of the multiple reflections undergone by the vibrations in the so-inserted reverberation units. The new electric signals can of course be used, after amplification if necessary, for energizing a loudspeaker or similar device.

2. Description of the Prior Art

In the prior art, reverberations are produced by suitably converting a sound-frequency electric signal to a plurality of sound frequency signals. A signal, which is the electric equivalent of a sound, is hereinafter called the input signal. Thus an artificial reverberation system or device converts a number of input signals simultaneously to output sound frequency signals. For simplicity, only a single input signal will be mentioned except in special cases.

The term "reverberation unit" is used to define a system or device for artificially producing reverberation effects from a sound-frequency input electric signal. From an input signal the reverberation unit provides a plurality of outputs of sound-frequency electric signals which energize loudspeakers or headphones and produce the desired acoustic reverberation effect.

It is also known that a mechanical reverberation unit of the coiled spring type provides an artificial reverberation effect. The known unit comprises a plurality of coiled springs used as a transmitter of mechanical sound vibrations and are aligned into one or several systems all parallel to a common axis or direction. Such a reverberation unit with a coiled spring system is exemplified in U.S. Pat. No. 3,106,610 filed on Jan. 30, 1961. The system described in this patent comprises a plurality of coil springs individually mechanically coupled at one end to movable elements of a first transducer and at the other end to movable elements of a second transducer. The coil springs are supported solely therebetween in parallel positions by their connections to said movable elements. The mechanical vibrations are provided by means of a first transducer as an electromechanical driver via the corresponding movable elements which are energized when the input terminals of the first transducer receives a sound-frequency signal. The second transducer serves as a mechanical-electric pick-up and is energized by the mechanical vibrations to generate to its output terminals an electrical signal whenever its movable elements are vibrated.

Owing to the low coupling characteristic between a coil spring and transducer or at the most two coil springs and the connections of ends of each aligned coil spring system with the movable elements of the transducers, mechanical mismatches are very frequent between the systems and the transducers. Since the number of coil springs is relatively small, the mechanical characteristics of the component elements, such as coil springs must necessarily be made very exact. However, the reverberation unit, due to these characteristics, is sensitive to output vibrations and thereby introduces some inherent distortion from the coil springs. The relatively low efficiency of these reverberation units which results from the prior art design limits the usefulness and also such operating characteristics as the reverberation time.

OBJECT OF THE INVENTION

The principal object of the present invention is to provide an improved reverberation apparatus in which each coil spring system comprises a lattice in at least two dimensions connected to a rigid frame whereby the mechanical characteristics of a system and its dimensions are thereby adapted for good mechanical matching impedance.

SUMMARY OF THE INVENTION

Another object of the present invention is to provide a rigid two or three-dimensional frame, used to maintain the shape and position of the two or three-dimensional lattice or lattices and to maintain each spring at the desired tension. Usually, the vibration drivers and pick-ups are mounted on holders secured to the frame.

Yet another object of the invention consists in the physical construction of a modular elementary mechanical reverberation unit and in making combinations of modular reverberation units having different characteristics for obtaining certain desired overall characteristics of output signals.

A further object of the present invention is to provide an apparatus for providing reverberation of electrical sound-frequency signal which comprises at least one reverberation unit for transmitting sound-frequency mechanical vibrations, each said reverberation unit comprising a system of coil springs, at least one input connected to an electro-mechanical driver transducer for converting said sound-frequency electric signals into said mechanical vibrations and at least one output connected to a mechanical-electric pick-up transducer for converting said mechanical vibrations into new sound-frequency electric signals, said system of coil springs partly forming lattice in at least two dimensions, in which said coil springs are mechanically interconnected at a number of coupling points, and in which at least some of said coil springs are connected to a rigid frame.

A reverberation apparatus embodying the invention substantially comprises:

a. a signal input means to which the input signal for sound frequency is applied;

b. a primary input electronic circuit including an amplifier to suitably amplifies the input signal;

c. A number of secondary input electronic circuits or amplifiers to suitably modify and re-amplify the signal from the primary input amplifier to produce a number of distinct signals; and d. one or more elementary mechanical reverberation units, each substantially comprising the following:

(1) one or more vibration drivers each of which is supplied, directly with one or more of the signals from the primary input electronic circuit from the secondary input electronic circuits;

(2) a system of coil springs to constitute one or more sets of mechanically coupled solid body systems in which the vibration drivers produce a field of mechanical waves which are progressively propagated, reflected and attenuated; whereby the mechanical coupling provides an elementary mechanical reverberation between two solid bodies at a given instant which are located at two different points and are never totally independent from each other;

(3) one or more vibration pick-ups placed in contact or adjacent of the solid body to produce reverberated electric signals; and (4) one or more devices for mechanically damping the waves propagating in the solid bodies;

e. a number of primary output electronic circuits with amplifiers to suitably modify and amplify the electric signals produced by the various vibration pick-ups;

f. one or more secondary output electronic circuits and amplifiers, supplied either directly with the signals from the various vibration pick-ups or with the signals produced by the secondary output electronic circuits or amplifiers these secondary circuits, producing one or more output electric signals by mixing, amplification and modification; and g. one or more signal outputs at which the outgoing signals can be obtained.

In addition, a mechanical reverberation apparatus embodying the invention comprises:

(a) one or more auxiliary control (or remote-control) devices for modifying the input or output signals (varying the gain or amplitude/frequency response of the amplifiers, compressing or extending the amplitude, mixing signals, etc);

(b) one or more devices for subjecting the output signals to one or more fixed delays (pure delay lines); and (c) a device comprising a control means (or remote-control means) for varying the reverberation time of the reverberator to a certain extent.

In a preferred form, a mechanical reverberation apparatus comprises a suspension system for substantially protecting the elementary mechanical reverberation unit or units from interference by mechanical vibrations of any origin other than those deliberately produced by the vibration drivers. The suspension system may include a locking device for transport.

Finally, the mechanical reverberator can be protected by a solid covering (i.e., a box or casing) against interfering vibration induced by acoustic waves.

Another object of the present invention is to provide a rigid two or three-dimensional frame, used to maintain the shape and position of the two or three-dimensional lattice or lattices and, if required, to maintain each spring at the desired tension. Usually, the vibration drivers and pick-ups are mounted on holders secured to the frame.

Yet another object of the invention consists partly in the physical construction of a model elementary mechanical reverberation unit and partly in combination of reverberation units having different characteristics for obtaining certain desired overall characteristics of output signals.

In accordance with the object of the present invention, an apparatus for providing reverberation of electrical sound-frequency signal, comprises at least one reverberation unit for transmitting sound-frequency mechanical vibrations, each said reverberation units comprising a system of coil springs, at least one input connected to an electro-mechanical driver transducer for converting said sound-frequency electric signals into said mechanical vibrations and at least one output connected to a mechanico-electric pick-up transducer for converting said mechanical vibrations into new sound-frequency electric signals, said system of coil springs partly forming lattice in at least two dimensions, in which said coil springs are mechanically interconnected at a number of coupling points, and in which at least some of said coil springs are connected to a rigid frame.

BRIEF DESCRIPTION OF THE DRAWINGS

The foregoing and other objects, features and advantages of the invention will be apparent from the following more particular description of preferred embodiments of the invention as illustrated in the accompanying drawings.

DESCRIPTION OF THE PREFERRED EMBODIMENTS

Figure 1:
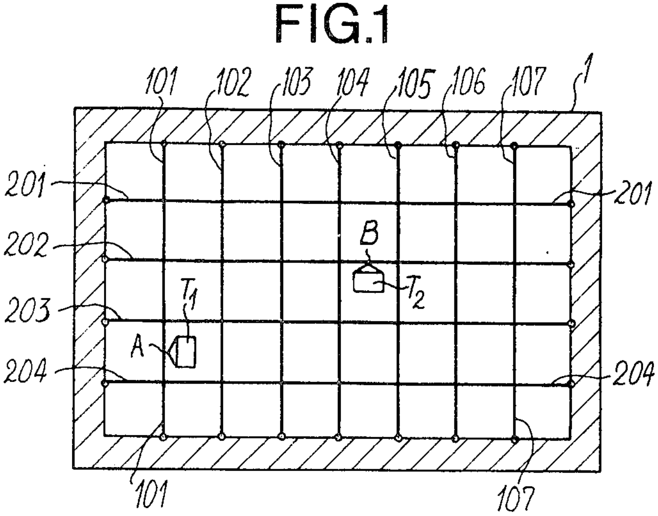
FIG. 1 shows a simple embodiment of reverberators according to the invention in the form of a two-dimensional lattice of helical springs coupled to a vibration driver and pick-up.
Figure 2:
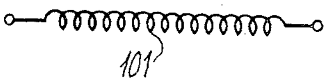
FIGS. 2 and 3 show some details of the springs in FIG. 1.
Figure 3:

FIG. 1 shows a rigid rectangular frame 1 on which the ends of helical springs 101 to 107 are secured parallel to two sides (vertical) and the ends of other helical springs 201 to 204 are secured parallel to the other two sides horizontal. To simplify the drawing, the springs have been shown as straight lines, but of course their real shape can be as shown in FIG. 2 or FIG. 3 and their longitudinal axis need not be straight but can be curved. In FIG. 2, accordingly, a spring such as 101 or 201 is in the form of a long thin helix. In the example represented in FIG. 3, the spring also has constrictions such as 301, 302 at some or all the connections between springs in the series denoted by 101 to 107 and 201 to 204 respectively in FIG. 1. In all cases, contacts are made between the springs at the places where they intersect, the contacts being rigid or resilient.

Two given points A, B on any two springs are coupled to transducers $T_1$, $T_2$, i.e., the aforementioned vibration driver and pick-up respectively.

Figure 4:
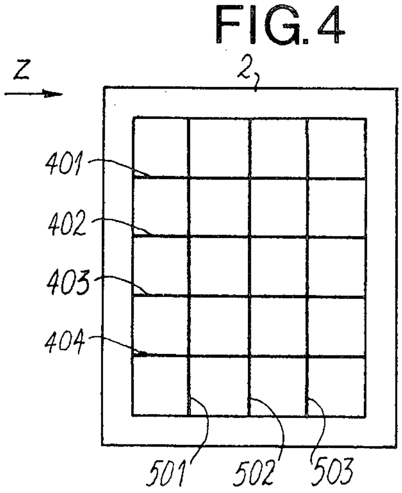
FIG. 4 is a simplified side view of an embodiment of a reverberator according to the invention in the form of a three-dimensional lattice of helical springs.

FIG. 4 is a side view of a system of springs forming a three-dimensional lattice, one front side is identical with that represented in FIG. 1 in the case of a two-dimensional system. The system in FIG. 4, shown in the direction represented by arrow Z, has an appearance identical with FIG. 1, but is bounded by a frame 2 in the form of a rectangular parallelepiped frame 2. In addition to springs 101 to 107 and 201 to 204 in FIG. 3, the system comprises other springs 401 to 404 and 501 to 503, the first of which is perpendicular to the plane defined by the preceding springs and the second of which is parallel either to springs 101 to 107 in FIG. 1 or springs 201 to 204 in FIG. 1, but the second is offset therefrom by a constant distance in the Z direction. The various springs in the system in FIG. 4 are placed in planes such that a certain number of non-parallel springs are in contact at various connection points. Thansducers similar to $T_1$ and $T_2$ of FIG. 1 are placed in contact respectively with any two springs in the systel in FIG. 4. All of the springs in the system in FIG. 4 are secured to both ends to the parallelepiped frame 2.

The various springs forming the lattice or lattices can be mechanically coupled in various ways, e.g. by welding or sticking or by mechanical clamping or by compression attachment means or by simple contact pressure. Alternately, mechanical vibrations between any two springs not in contact with one another can be transmitted by using a "vibration conductor" different from a spring, e.g. a metal rod such as a piano wire which in turn is coupled to the springs by any of the previously-mentioned methods.

The method of mechanically coupling a device unit or pick-up unit to one or more springs in the lattice depends on the particular type of driver or pick-up used. The coupling must be adequate to transmit mechanical vibrations over the entire desired frequency band.

In the case of a direct contact pick-up unit, the coupling can usually be brought about by one of the methods mentioned hereinbefore in connection with the coupling of springs.

The springs may be rigidly connected to the frame, e.g. by using one of the aforementioned methods of mechanical coupling, or may be connected semi-rigidly or loosely, e.g. via natural or even synthetic rubber elements for somewhat damping the mechanical waves.

The semi-rigid of soft coupling elements may also be used to connect springs.

The driver units may be any kind of electro-mechanical transducer adapted to produce mechanical vibrations at sound frequency from an electric input signal of suitable amplitude. However, it is preferred in an elementary mechanical reverberation unit embodying the invention to use one or more piezoelectric drivers particularly because of their low cost. In that case, since the drivers usually operate with relatively high-voltage signals, it is convenient to supply each driver with a conventional power amplifier, i.e. one which delivers low-voltage signals at low impedance, followed by a voltage step-up transformer. Advantageously a disc-recording element may be used such as a vibration driver.

In order to further reduce the cost of the preferred embodiment of elementary mechanical reverberation unit, the driver unit is made of ordinary piezoelectric disc read-out heads as are used for mass-produced record-players. Each head can be mechanically coupled to one spring in the system, inter alia, by sticking, or alternatively the small arm bearing the sapphire or diamond on the read-out head can be kept between two sufficiently close turns of the spring; in some cases coupling can be obtained by simple contact pressure between the arm (and the sapphire or diamond) and two adjacent spring turns.

The driving input voltage at the terminals of each head can reach an amplitude of the order of 100 volts.

The vibration pick-up units can be any kind of mechanico-electric transducer adapted to produce an electric output signal from mechanical vibrations, such as a motion, speed or acceleration pick-up device.

In the preferred embodiment, the pick-ups are low cost direct-contact electrodynamic or piezoelectric pick-up devices, these having good frequency pass-band characteristics, high efficiency and low non-linear distortion. With disc read-out heads from record players each head is mechanically coupled to one spring in the system by one of the methods previously mentioned.

Of course, the pick-ups may be stereophonic which deliver two different reverberated electric signals in each case.

With helical springs forming the lattice system, the system can operate under tension or compression. Usually, however, it is more convenient to use springs operating under tension, the springs being tensioned to some extent in the static state.

The springs can be of various metals or alloys, steel and bronze being particularly suitable.

The mechanical characteristics of the springs and vibration pick-ups and drivers are not critical. However, if the following recommendations are followed, it is easier to obtain satisfactory operation and good reverberation characteristics a. The stiffness and linear weight of the springs must be well adapted to the stiffness, dynamic weight and mechanical strength characteristics of the vibration drivers used, since an excessive mismatch of mechanical impedance between the spring and driver in contact therewith will lower the excitation efficiency (i.e., the electro-mechanical conversion efficiency or the ratio of the mechanical energy produced in the reverberation apparatus to the electric energy absorbed by the driver).

b. Similarly, the stiffness and dynamic weight of the vibration pick-ups must be well adapted to the mechanical characteristics i.e., stiffness and linear weight of the springs, an excessive mismatch of mechanical impedance between the pick-up and the spring in contact therewith will lower the reverse electro-mechanical conversion efficiency. In the case of the pick-up, the mechanical impedance mismatch may be relatively large since the important factor in this case is not the conversion efficiency but the absolute peak amplitude of the electric output signal produced by the pick-up, which must be very high compared with the background noise level of the output amplifier. This level depends on the efficiency of the pick-up and on the amplitude of the vibrations at the point of contact between the pick-up and the spring lattice. The vibration amplitude increases in proportion to the amplitude of the vibrations initially communicated to the spring lattice by the vibration driver or drivers, and inversely in proportion to the extent to which the pick-up opposes the free vibration of the springs in the contact region. Consequently very different compromises between the various mechanical and electric characteristics of the pick-up and springs can yield the same result, i.e., an adequate signal level at the pick-up output.

Referring drivers and pick-ups, the band-pass must cover at least the spectrum of the desired reverberated signal i.e., usually from a few tens of Hz to a frequency of 4 kHz or above. Note that the "band-pass" refers to the pick-up (or driver) coupled to the spring lattice. The limits of the band-pass depend inter alia on the mismatch of mechanical impedance between the pick-up or driver and the spring coupled thereto, at the highest frequencies.

The springs used to form a two-or three-dimensional lattice in an elementary machanical reverberation unit can vary with respect to the material, the diameter of the turns, the diameter of the wire, the initial stress, etc. An excessive mismatch in mechanical impedance between two mechanically interconnected springs will adversely affect the transmission of vibration from one to the other. Thus, there is no point in varying the types of springs used unless it does not result in a systematically large mismatch of mechanical impedance between two interconnected springs and in this case the term "lattice" would have no meaning, in view of the propagated mechanical vibrations.

In practice, the mechanical reverberation unit embodying the invention, constructed from a lattice using a single type of spring, operates in a perfectly satisfactory manner provided that the following recommendations are followed with regard to the dimensions of the lattice.

Although the dimensional characteristics of the spring lattice is not critical, the attainment of a good subjective quality of reverberation is in particular connected with:

(a) the large number of natural resonance frequencies of the mechanical reverberation apparatus per frequency band width ("density of resonance frequencies" expressed as the number of frequency resonances per hertz);

(b) the random character of the resonance frequency distribution;

(c) the large number of "elementary echoes" produced per unit time by the mechanical reverberation apparatus (the "echo density" expressed as the number of echoes per second);

(d) the random character of the elementary echo distribution in function of time; and (e) the attainment of suitable values of the reverberation time, i.e., usually of the order of a few seconds. The values must not be excessively large (e.g. above 10 seconds) for low frequencies, or excessively small (e.g. below 2 seconds) for high frequencies.

To meet the above requirements *a–e,* other things being equal, the resonance frequency density and the length of the reverberation time increase in proportion to the length of metal wire used for each spring in the lattice. On the other hand, the echo density increases with the number of points of reflection of the mechanical waves propagating in the springs, the number of points is the sum of the ends of the springs and the mechanical coupling points of the springs forming the lattice. The reverberation time obtainable at a given frequency, in a narrow frequency band centred around the given frequency always increases, other thing being equal, with the length of metal wire in the springs or spring portions between two intermediate or end reflection points. These intermediate and end points are places where the springs are mechanically connected or where a spring is secured to the frame or to a driver or pick-up.

A compromise has to be made if satisfactory values of the various aforementioned parameters are to be obtained simultaneously. An example of such a compromise is given hereinafter and will give an idea of the orders of magnitude in question.

The random character of the resonance frequency distribution, like that of the echo distribution, is clearly linked with (1) the relatively random distribution of the dimensional parameters of the lattice entering into the construction of the elementary reverberation unit (i.e., the length of each spring, the distance between the various coupling points, the angles between pairs or springs, etc) and (2) the variety, if any, in the types of springs used. As soon, however, as the number of springs forming the lattice becomes sufficiently large, for example over 20, this number being given only by way of indication, the proportions necessary a priori for obtaining random distribution of resonance frequencies and echoes rapidly becomes unimportant, since the random acoustic characteristics of the reverberation apparatus result naturally from irregularities in manufacture. Care is taken to avoid narrow tolerances in the various lengths and angles of the lattice, and such care is easy to achieve.

The following remarks refer to the amplitude of the spring vibrations:

The amplitude of the "useful" vibrations produced in the spring of the reverberation apparatus by the vibration driver or drivers should be as large as possible. This is in order to obtain sufficient freedom from the influence of interfering vibration produced in the springs by direct mechanical or acoustic excitation due to external vibrations and sounds. The effect of interfering vibrations is to superpose an interfering background noise on the useful output signals or, possibly, to produce a self-excitation by the LARSEN effect when the reverberated signals produced by the reverberation apparatus are amplified and acoustically reproduced by loudspeakers near the apparatus. However, the amplitude of useful vibrations is necessarily limited by the following characteristics:

(1) the limited power, mechanical ruggedness and linear operating region of the driver or drivers;

(2) the limited mechanical ruggedness and linear operating range of the pick-up or pick-ups;

(3) the need to avoid producing non-linear phenomena in the actual springs such as by exceeding the elastic limit or by having two contiguous turns bumping together; and (4) the limited rigidity and mechanical strength of the various coupling points, e.g. coupling points between springs or with the frame or with the drivers or the pick-ups. Note that the method of coupling springs by simple contact pressure, which has the advantage of simplicity and low cost, has the disadvantage that the amplitude of the spring vibrations must remain small enough to prevent a spring moving relative to another spring at a point of contact, since such movement would inevitably produce interfering frictional noise, which must be avoided at all costs.

EXAMPLE OF THE CONSTRUCTION OF AN ELEMENTARY MECHANICAL REVERBERATION UNIT EMBODYING THE INVENTION a) Common characteristics of all the springs used

Helical tension springs: steel; wire diameter 0.4 mm; diameter of turns 3 mm; stiffness 51 N/m.

b) Characteristics of lattice

The lattice is two-dimensional and rectangular. Each spring therein is directly secured at each end to a rectangular metal frame measuring 35 × 50 cm. The springs are roughly parallel to one or the other side of the frame, and intersect at approximately right angles.

The springs forming the lattice are divided into two groups of lengths; these for placing parallel to large sides of the rectangle have a length in no operation e.g. in the absence of tension, the length being the order of 25 cm, whereas the springs for placement parallel to the small sides have a length in no operation of the order of 17 cm.

The lattice is made up of 15 springs which are parallel to the small sides of the rectangle and 11 springs parallel to large sides. The spacing between pairs of adjacent parallel springs is approximately constant, of the order of 3 cm.

The springs are interlaced, i.e., each spring is placed perpendicularly to other springs which pass alternately above and below it the lattice is to be placed in a horizontal plane.

The mechanical coupling between springs thus obtained by simple contact pressure is sufficient if the amplitude of vibration of the springs (i.e., the amplitude of longitudinal motion, parallel to the spring axis) is limited to quite low values. If it is desired to increase the amplitude of vibration in order to improve the signal-to-noise ratio at the mechanical reverberator output, it is advantageous to strengthen the mechanical coupling, e.g. by depositing a fine drop of adhesive at the contact point between the two springs. Preferably a single point on one turn of one spring is stuck to a turn of the other spring, so that the reflection coefficient of the mechanical waves at the coupling point is not excessive as a result of an excessive local mismatch of mechanical impedance.

c) Drivers

A single vibration driver is used, i.e., a piezoelectric readout head for monophonic records. The head is secured to a metal plate or bar secured to the frame at any point in the central region of the lattice — e.g., by way of illustration, at a point having the approximate coordinates $x = 24$ cm and $y = 24$ cm-, the coordinate axes being any two perpendicular sides of the rectangle formed by the connection points where the springs were connected to the frame, the $x$ abscissa axis being a large side and the $y$ ordinate axis being a small side. The read-out head, relative to the spring in contact therewith, is placed on a position such that longitudinal vibrations of said spring produced lateral vibration of the needle-bearing head, in exactly the same manner as a monophonic track is read on a record.

The mechanical coupling of the spring is acomplished by a small blob of very hard adhesive (e.g. of the kind commercially known as "Araldite").

The head is connected to the secondary winding of a step-up transformer having a ratio of 40, the transformer primary being supplied by a 1 W semiconductor power amplifier. The rms voltage at the terminals of the driver head reached a maximum of 20 Volts.

d) Pick-ups

Two vibration pick-ups are used, each being an electromagnetic head for reading stereophonic records. Each head is secured to a metal plate or bar secured to the frame at a given point in the central region of the lattice and one head is located at a point having the approximate coordinates $x = 18$ cm, $y = 15$ cm in the previously-chosen coordinate axe system.

Each head, relative to the spring in contact therewith, is placed in the same position as defined previously for the driver (i.e., the symmetry plane of the head containing the needle-bearing rod is perpendicular to the spring axis). The mechanical coupling of the spring is accomplished by a small blob of very hard adhesive (e.g. of the kind commercially known as "Araldite").

The rms output voltage at the terminals of each pick-up head is of the order of 0.3 mV when the driver-head is supplied with a noise signal having a band centred at 1000 Hz and 300 Hz wide, at an rms voltage of 20 V.

e) Results

The reverberation time r.t. obtained with the aforementioned elementary mechanical reverberation unit has had approximately the following values in function of end frequencies $f$ of six octaves:

| f | 125 Hz | 250 Hz | 500 Hz | 1000 Hz | 2000 Hz | 4000 Hz |
|---|---|---|---|---|---|---|
| r.t. | 8 s | 6.5 s | 5 s | 3 s | 2 s | 1.5 s |

The reverberation time was measured in ⅓ octave bands.

The exact limits of the band-pass of the reverberation apparatus depend inter alia on the exact characteristics of the various record read-out heads used. Using conventional models, the limits are roughly 50 Hz to 15 kHz.

COMBINATIONS OF ELEMENTARY MECHANICAL REVERBERATION UNITS

When a reverberation apparatus is manufactured for a particular application, it may be desired to obtain a certain set of characteristics — e.g., reverberation times for different frequencies, resonance frequency densities, echo densities, etc. — which is very difficult to obtain simultaneously from a single elementary reverberation unit since these characteristics depend on compromises which may be incompatible.

The invention provides a judicious combination of different elementary mechanical reverberation units, the reverberated signals obtained therefrom being mixed in suitable proportions (preceded by filtering if required) to obtain the desired overall characteristics.

Since the measurable and significant characteristics vary greatly with frequency, it is sometimes practically impossible to obtain a certain set of values of these characteristics for different frequency values using a single reverberation unit. The useful sound-frequency spectrum is divided into a certain number of narrower frequency bands within each of which it is possible to obtain the desired values of the characteristics by means of a suitably constructed elementary mechanical reverberation unit. The division of signal spectrum and the reverberated signals from the different reverberation units are subsequently obtained by means of secondary input electronic circuits or amplifiers and primary output electronic circuits of amplifiers as mentioned in the preamble to the present description.

The application of this principle of the invention will be more clearly understood from the following example.

Example: Reverberation times varying relatively slightly with frequency obtained by combining two elementary mechanical reverberation units In a mechanical reverberator, the reverberation time usually decreases with frequency. Although this property is also usually found in natural reverberation, it is often very exaggerated in mechanical reverberations and it is nearly always desirable to use means whereby the variation in the reverberation time with frequency is kept small over a fairly wide frequency range.

Referring to a mechanical artificial reverberation apparatus comprising spring lattices embodying the invention, this result can be obtained in very simple manner by combining two elementary mechanical reverberation units as follows:

the first unit is adapted for reverberating medium and high frequencies —e.g., by way of illustration, frequencies above 500 Hz. If used alone, it will give reverberation times which are much too long at low frequencies;

the second unit is adapted to obtain the desired reverberation times at low frequencies, i.e., below 500 Hz. To this end, it is made up e.g. of a spring lattice provided with a suitably adjusted mechanical damping device, which can always be conveniently done. The second unit, if used alone, will have a reverberation time which is much too short at high frequencies; and by means of a high-pass filter, only the medium and high frequencies of the input signals are sent to the drivers of the first reverberation unit, whereas the driver or drivers of the second reverberation unit receive only the low frequencies of the input signal, through a low-pass filter.

Next, the signals from the two reverberation units may be mixed in suitable proportions to form a complete reverberated signal, one comprising all the low, medium and high frequencies.

The following alternative method may also be used. The total input signals, i.e., without filtering, is simultaneously applied to the drivers of both reverberation units. Next, the output signals from the reverberation units are mixed in suitable proportions after filtering them in suitable high-pass and low-pass filters. In some cases, there may not be any need for low-pass filtering of the signals coming from the reverberation unit and adapted to reverberate low frequencies since the last-mentioned unit may already act as a mechanical low-pass filter, if a mechanical damping device is used.

In some cases, it may be advantageous to combine the two previously-mentioned methods, i.e., to filter the signals for each reverberation unit both upstream of the driver and downstream of the pick-ups. The choice of a particular solution depends interalia on an optimum compromise between obtaining the best signal-to-noise ratio on the one hand and the simplicity; i.e., the cost, of the electronic circuits on the other hand. This, however, does not affect the principle of the invention, which consists in combining two different reverberation units specially designed to reverberate a particular part of the signal spectrum in optimum manner.

Of course, the same combination principle extends to the case where the signal spectrum is divided into more than two complementary parts, e.g. three or four complementary parts.

METHODS OF VARYING THE REVERBERATION TIMES

In a "natural" reverberation room, i.e., a reverberating room in which sounds are emitted by one or more loudspeakers and collected by one or more microphones, it is relatively difficult to change the reverberation times. In the case of artificial reverberation apparatus, on the other hand, it is conventional to use a system for varying the reverberation times within certain limits. In mechanical reverberation apparatus, the variation is conventionally obtained by purely electronic means or by mechanical means — i.e., increasing or reducing the damping effect of the vibrating mechanical system.

In principle, most known methods used for other mechanical reverberation apparatus can a priori be applied equally well to mechanical reverberation apparatus embodying the invention. Alternatively, one may use the following principle.

Owing to the very low cost and small bulk of the "vital" part of the reverberator — i.e., the previously-described elementary mechanical reverberation unit — it is particularly easy to construct and join together a number of mechanical reverberation units having different spring lattices, each characterized by a certain set of reverberation times. In that case, either one reverberation unit can be selected, using a step switch and thus obtaining a variation by frequency jumps in the reverberation time, or two or more reverberation units can be combined, using suitable electronic devices, to obtain the desired effects. For example, the reverberated signals from two or more different mechanical reverberation units can be mixed in variable proportions and the variations can occur in jumps or can take place continuously. The present device is characterized by sets of reverberation times which differ appreciably from one another, and the proportions of the mixture being varied to produce the desired variation of reverberation times.

The aforementioned principle of switching or mixing can be combined with the principle of combining two or more reverberation units by dividing the sound-frequency spectrum into a number of bands. Variable reverberation time in the present device can be constructed from the following in combination:

(1) a single elementary mechanical reverberation unit specially adapted to reverberate high frequencies; and (2) a number of different elementary mechanical reverberation units specially adapted to obtain certain desired reverberation times at low or medium frequencies; the resulting reverberated signals being obtained by filtering and mixing in suitable proportions of the signals from a) the elementary mechanical reverberation unit for high frequencies and b) one elementary mechanical reverberation unit from the set of units for low and medium frequencies.

SPECIAL APPLICATION: SPECIAL SOUND RELIEF EFFECTS

The principle of a mechanical reverberation apparatus comprising a spring lattice embodying the invention if particularly applicable to the use of a number of pick-ups. The signals from the various pick-ups each forms a separate reverberated signal differing inter-alia with respect to the delay-time due to the propagation time of the mechanical wave in the springs. The delay time between the appearance the transmission of the input signal and, after being amplidied and suitably shaped forms an equivalent number of different output signals for the artificial reverberation room. These different signals can be used for supplying a number of loudspeakers suitably distributed in a room. Each loudspeaker or group of loudspeakers can be supplied either directly with one of the output signals or with a linear combination which may be different in each case of the output signals. It is thus easy, to reconstitute a reverberating relief effect in a room which is much closer to that of a real reverberating room than if only one or even two output signals were used.

What we claim is:

1. A mechanical reverberation apparatus comprising:

a rigid frame;

a lattice within said rigid frame consisting of a system of first arrayed coil springs and a system of second arrayed coil springs which are transverse to said first coil springs, a first predetermined number of said first coil springs being connected at their ends to said rigid frame and spaced to intersect a second predetermined number of said second springs to form thereby a network within said frame;

said lattice being in the form of at least a 2 dimensional array of said springs in a space covering a portion of an area which is substantially flat;

an electro-acoustic driver transducer;

an acousto-electric pick-up transducer;

said two systems of coil springs having at least one input connected to said electro-acoustic driver transducer to convert sound frequency electrical signals into mechanical vibrations;

each said system of coil springs having at least one output connected to said acousto-electric pick-up transducer to convert mechanical vibrations into new sound frequency electrical signals; and a plurality of said coil springs having their ends in the form of direct joining contact with each other by contact pressure to thereby provide a certain number of coupling points at said joining ends interconnecting said coil springs to said lattice and to each other.

2. An apparatus according to claim 1 in which some of said plurality of said interconnected coil springs are rigidly interconnected at some of said coupling points by rigid connecting means.

3. An apparatus according to claim 1 in which at least some of said plurality of interconnected coil springs are resiliently interconnected at at least some of said coupling points by resilient connecting means.

4. An apparatus according to claim 2 in which said rigidly interconnected coil springs comprise mechanical means mechanically interconnected to said coil springs by means of solid joining elements which transmit mechanical vibrations.

5. An apparatus according to claim 3 in which said resilient connecting means include a soft element which connects at least one of said coil springs to said rigid frame so as to dampen the mechanical waves transmitted by said lattice.

6. An apparatus according to claim 1 in which at least one of said electro-acoustic pick-up transducers is a piezoelectric transducer.

7. An Apparatus according to claim 1 in which also at least one of said electro-acoustic driver transducers is an electromagnetic transducer.

8. An apparatus according to claim 1 in which one of said acousto-electric pick-up transducers is a record player read-out disc.

9. An apparatus according to claim 8 including a plurality of outputs connected to a plurality of electro-acoustic pick-up transducers supplying a plurality of distinct sound-frequency electric signals for producing sound relief effects and atmospheric effects from a number of loudspeakers which are placed in a room.

10. An apparatus according to claim 9 comprising at least two reverberation units for transmitting sound frequency mechanical vibrations which are connected to each other, each comprising a system of said coil springs and each unit of said system having different characteristics of reverberation times at various sound-frequencies compared to the other unit of said system.

11. An apparatus according to claim 10 in which at least two of said units are units specially designed for reverberation, one in a first sound-frequency range and the other in a second sound-frequency range different from said first range, said two units operating simultaneously and in combination, and which is further provided with frequency filters to produce acoustic characteristics dependent on frequency.

* * * * *